United States Patent [19]

Harwood et al.

[11] 3,970,948
[45] July 20, 1976

[54] CONTROLLER GAIN SIGNAL AMPLIFIER

[75] Inventors: Leopold Albert Harwood, Somerville; Erwin Johann Wittmann, North Plainfield, both of N.J.

[73] Assignee: RCA Corporation, New York, N.Y.

[22] Filed: Dec. 6, 1974

[21] Appl. No.: 530,405

[52] U.S. Cl. ............................ 330/29; 330/30 D; 358/27
[51] Int. Cl.[2] .................................. H03G 3/30
[58] Field of Search ............ 330/29, 30 D; 358/27

[56] References Cited
UNITED STATES PATENTS

| | | | |
|---|---|---|---|
| 3,740,462 | 6/1973 | Harwood | 358/27 |
| 3,772,463 | 11/1973 | Wakai et al. | 358/27 |

*Primary Examiner*—R. V. Rolinec
*Assistant Examiner*—Lawrence J. Dahl
*Attorney, Agent, or Firm*—Eugene M. Whitacre; Kenneth R. Schaefer; Ronald H. Kurdyla

[57] ABSTRACT

A signal amplifier is supplied with input signals at its base electrode and also is supplied at its emitter with quiescent operating current from a current source. Amplified output signals developed at the collector of the amplifier are coupled to a transistor-diode current splitter. The relative division of current in the splitter is controlled by coupling a variable direct current supply to the diode. The latter supply comprises a source of direct voltage, a variable, resistive voltage divider coupled across the voltage source, and the combination of a voltage follower stage and a series resistor coupled between the resistive divider and the diode. Gain controlled push-pull output signals may be provided by differentially coupling a second amplifier device to the first and coupling the output of a second current splitter to the second amplifier. The second current splitter is then also controlled by the same current source as the first.

8 Claims, 1 Drawing Figure

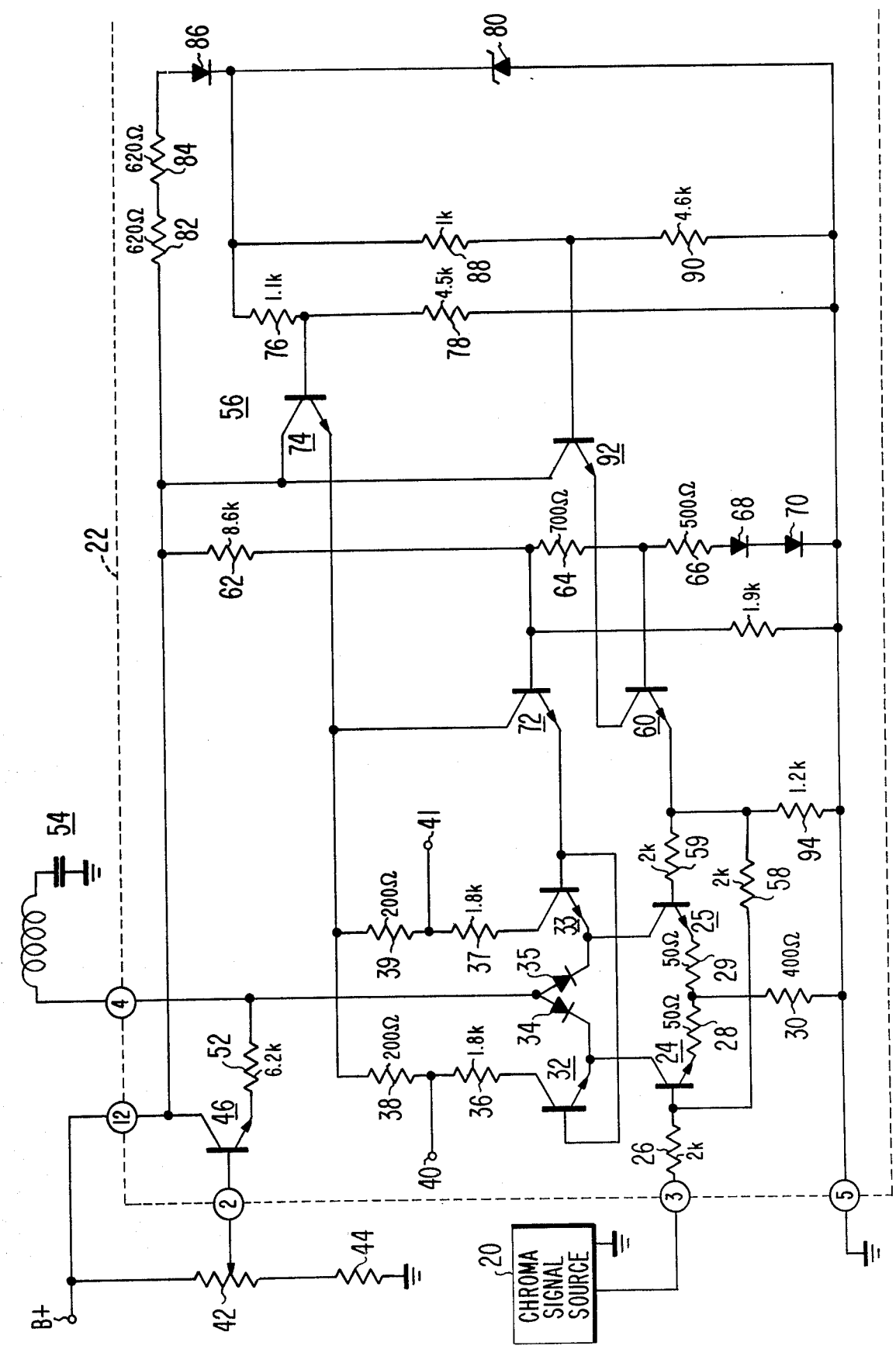

CONTROLLER GAIN SIGNAL AMPLIFIER

This invention relates to controllable gain electronic signal amplifier circuits and, in particular, to circuits of this type which are particularly suitable for implementation utilizing monolithic integrated circuit construction techniques.

Controllable gain signal amplifier circuits are widely used, for example, in television receivers to control volume, color saturation, tint and contrast functions. When a portion of such a signal processing circuit is formed as an integrated circuit and the control member is provided by an external variable resistance, a problem is encountered in providing suitable tracking or matching between the integrated and non-integrated (discrete) portions of the circuit. That is, tolerance variations of the integrated circuit elements such as resistors and of the external components are unrelated. As a result, the amplifier gain (or attenuation) at each particular setting of the variable resistance cannot be reproduced with a certainty which is desirable in mass-produced products and additional centering adjustments are required.

A number of different approaches have been taken to solve such problems, some examples of which are described in U.S. Pat. No. 3,740,462, entitled "Automatic Chroma Gain Control System," granted June 19, 1973 in the name of Leopold Albert Harwood, in U.S. Pat. No. 3,649,847, entitled "Electronically Controlled Attenuation And Phase Shift Circuitry," granted Mar. 14, 1973 in the name of Allen LeRoy Limberg, and in the Linear Integrated Circuit Data Sheet, File No. 412, published by RCA Corporation, Somerville, N.J. which relates to the CA3065 type television sound system integrated circuit.

In the CA3065 system, a differential amplifier current splitter arrangement is used in conjunction with a d.c. potentiometer to provide audio volume control. In that type circuit, a relatively small variation in the gain control voltage (e.g. several hundred millivolts) produces a change in conduction from one extreme to the other in the current splitter.

In the Limberg patent, several circuit arrangements are described which employ a combination of a diode and a transistor coupled together in a differential or current splitter configuration. Signal current is supplied to the junction of the emitter of the transistor and one electrode of the diode. Conductivity of the diode and consequent division of the signal current between the diode and the transistor is controlled by means of a variable direct current supply including a variable resistance coupled to the second electrode of the diode. While such arrangements exhibit a number of desirable characteristics, as compared to the two transistor current splitter of the CA3065 type, additional characteristics such as constant loading on the signal current supply and a linear relationship between the setting of the variable resistance control and the output signal current are desirable in certain applications. For example, in the Harwood patent referred to above, a manual chroma signal gain control for use in a color television receiver is disclosed. In that case, the quiescent current supply of a differential signal amplifier is varied according to the setting of a potentiometer. The potentiometer wiper is coupled via a follower transistor and a series resistor to a diode. The diode is coupled across the base-emitter junction of the quiescent current supply transistor of the amplifier in a current mirror type of arrangement. In that case, a substantially linear relationship between potentiometer setting and amplifier signal gain is provided. However, impedance characteristics of the amplifier transistors, including reactive components such as capacitance, can change as the potentiometer setting is varied. When the signals which are controlled are at sufficiently high frequencies (such as a color subcarrier frequency of 3.58 MHz), these impedance variations can be significant. Specifically, in the context of a chroma signal processing system of a color television receiver, such capacitance variations can introduce undesired differential phase shifts in the chroma signals as a function of the gain control setting. These phase shifts can result in an error in hue (tint) of a reproduced scene if they are introduced at a point in the signal processing chain such that the chroma signals but not the reference burst component are varied in phase.

In accordance with the present invention, a controllable gain signal amplifier comprises a first signal amplification stage in which at least a first transistor having a signal input electrode and a main current conduction path including second and third electrodes is provided. A source of signals to be amplified is coupled to the input electrode, while a source of quiescent operating current is coupled to the second electrode. A second transistor and a semiconductor rectifier device are arranged in a current splitter circuit and are coupled to the third electrode of the first transistor. Gain controlling means is direct current coupled to the rectifier device for varying the relative flow of current through the rectifier and the second transistor. The gain controlling means comprises a source of direct voltage and a variable voltage divider coupled across the direct voltage source. An output terminal, at which a selected portion of the voltage is provided, is coupled to the base electrode of a third transistor. A resistance is direct current coupled between the emitter electrode of the third transistor and the recitifer device for supplying a variable direct current to the rectifier.

Additional aspects of the present invention will be more readily understood from a reading of the following description in connection with the accompanying drawing which is a detailed schematic representation, partially in block form, of a chrominance signal amplifier suitable for construction largely in integrated circuit form which embodies the present invention.

Referring to the drawing, a source of signals to be amplified, illustrated as a chroma signal source 20, is coupled to a terminal 3 of a chrominance signal processing circuit indicated generally by a reference numeral 22.

In the context of a color television receiver, a suitable chroma signal source 20 is provided by the commercially available RCA Corporation CA3126 integrated circuit and associated components. In that case, the chrominance signal processing circuit 22, which is also suitable for construction in integrated circuit form, would include appropriate chrominance signal demodulation circuitry in addition to the gain controllable amplifier to be described herein.

The illustrated amplifier comprises a first transistor 24 having a signal input (base) electrode coupled to terminal 3 by means of a resistor 26. The main current conduction path (collector-emitter) of transistor 24 is coupled via a degeneration resistor 28 to a further resistor 30 which, in turn, is coupled via a terminal 5 to a reference or ground potential. Resistor 30, in conjunction with an external voltage supply (e.g., +11.2 volts) coupled between ground terminal 5 and a B+ supply terminal 12, provides a source of quiescent operating current for transistor 24 and the remainder of the amplifier as will appear below.

A current splitter circuit comprising a second transistor 32 and a semiconductor rectifier device or diode 34 is coupled to the collector of transistor 24. Diode 34 and the base-emitter junction of transistor 32 are poled in the same direction with respect to the flow of collector current in transistor 24. Diode 34 may be fabricated, for example, as a transistor identical to transistor 32 but with collector shorted to base. The conduction characteristics of the two devices then will be substantially matched.

An output load circuit illustrated as series connected resistors 36 and 38 is coupled between the collector of transistor 34 and a source of operating voltage, details of which will be explained below. Amplified chroma output signals are provided at output terminal 40 for coupling, for example, to a following demodulator circuit (not shown).

The signal gain associated with the cascode combination of transistors 24 and 32 is controlled by means of a potentiometer or variable voltage divider resistor 42 coupled externally to signal processing circuit 22 between the B+ supply and ground terminals (12 and 5, respectively). An end limit resistor 44 may be included in series with potentiometer 42 if desired. A wiper arm of potentiometer 42 is direct current coupled via a terminal 2 to the base of a third transistor 46 within circuit 22. Direct control current is supplied from the emitter of transistor 46 to diode 34 via a series resistor 52. A signal bypass circuit comprising a series resonant combination 54 of inductance and capacitance is coupled from a terminal 4 to ground, the terminal 4 being coupled within circuit 22 to the junction of resistor 52 and diode 34.

Resonant circuit 54 is tuned, for example, to 3.58 MHz to provide a low impedance path to ground for color subcarrier signal components.

Bias potentials and currents are supplied to the above-described amplifier arrangement by means of a plurality of voltage divider circuits, indicated generally by the reference numeral 56, connected between terminals 12 (B+) and 5 (ground). Specifically, base bias is supplied to first transistor 24 via a resistor 58 and a follower transistor 60 by means of a voltage divider comprising resistors 62,64,66 and compensating diodes 68,70. The base of follower transistor 60 is coupled to the junction of resistors 64 and 66. Base bias voltage is supplied to transistor 32 by means of a second follower transistor 72 having its base coupled to the junction of resistors 62 and 64 (e.g., approximately one $V_{be}$ higher than the base of transistor 60). Appropriate B+ (collector supply) voltages are provided to transistors 32 and 72 by means of a third follower transistor 74. The base of transistor 74 is coupled to the junction of divider resistors 76 and 78, the series combination of which is coupled across a zener diode 80. Current is supplied to zener diode 80 from the supply terminal 12 via resistors 82, 84, and diode 86.

A second divider comprising resistors 88 and 90 is coupled across zener diode 80. The junction of the resistors 88 and 90 is coupled to a follower transistor 92 which is arranged to supply operating collector voltage to transistor 60.

The illustrated amplifier also includes a further amplifier-current splitter configuration like that described above but which provides oppositely phased output signals at a terminal 41. That is, current source resistor 30 is also coupled to the emitter-collector path of a transistor 25 via a resistor 29, the transistors 24 and 25 providing a differential amplifier. The collecter of transistor 25 is coupled to a second current splitter comprising a transistor 33 and a diode 35. Series-connected load resistors 37 and 39 are coupled to the collector of transistor 33 and output terminal 41 is provided at the junction of resistors 37 and 39. Similar electrodes (i.e., anodes) of diodes 34 and 35 are connected in common to resistor 52. Furthermore, the bases of transistors 32 and 33 are coupled in common to the bias voltage provided at the emitter of follower transistor 72.

Similarly, the base of transistor 25 is coupled to the emitter of follower transistor 60 by means of a resistor 59 substantially equal in value to resistor 58. A resistor 94 also is coupled from the emitter of transistor 60 to terminal 5 (ground).

The operation of the circuit of FIG. 1 will now be described for typical operating parameters consistent with the component values shown on FIG. 1 and consistent with a B+ voltage supply of +11.2 volts. In that case, a quiescent operating current of, for example, approximately 1.2 milliamperes is provided through resistor 30. In the absence of input signal, this current will divide substantially equally between the similarly biased transistors 24 and 25. If the gain control adjusting potentiometer 42 is set at one limit near ground potential, transistor 46 will be effectively cut off and no current will flow in resistor 52 and diodes 34, 35. In that case, neglecting the normally small difference between collector and emitter currents of NPN transistors, the collector currents of transistors 24 and 25 will flow, respectively, in transistors 32 and 33. The transistors 32 and 33 are operated in common base mode and form cascode signal amplifiers with their associated transistors 24 and 25. This arrangement provides the highly desirable effect of low collector-base-feedback capacitance and substantially no variation in phase shift of the signals at output terminals 40 and 41 as potentiometer 42 is varied. With this setting of potentiometer 42, one-half of the quiescent current from resistor 30 flows in each of the load circuits and maximum gain for signals supplied from source 20 is provided.

As the wiper arm of potentiometer 42 is moved towards the B+ terminal, transistor 46 will begin to conduct. Transistor 46 will conduct when the voltage at the wiper of potentiometer 42 approaches the bias voltage supplied to the bases of transistors 32 and 33 of the current splitters. By selection of the circuit parameters, diodes 34 and 35 may be arranged to conduct all of the quiescent operating current supplied via resistor 30 when potentiometer 42 is set approximately at B+, thereby cutting off transistors 32 and 33 to provide no output signals at terminals 40 and 41. It is desirable to produce the maximum attenuation when the wiper is approximately at the B+ end of potentiometer 42 so as to avoid any dead spots or unpredictability in operation of the circuit. To this end, the value of resistor 52 is selected so that the product of that resistance and the total current through resistor 30 (e.g., 1.2 milliamperes) is slightly greater (e.g., a few hundred millovolts greater) than the B+ voltage minus the base-emitter voltage ($V_{be}$) of transistor 46 minus the base bias voltage of transistors 32 and 33.

At settings of potentiometer 42 intermediate those corresponding to cutoff of transistors 32 and 33 on the one hand and cutoff of diodes 34 and 35 on the other hand, the voltage gain of the illustrated amplifier will vary in a substantially linear manner with respect to rotation of the potentiometer 42.

The cascode connection of transistors 24, 32 and 25, 33 provides excellent response characteristics in the frequency range of the normal color signals (i.e., 2–4 MHz). Furthermore, the circuit provides the desired characteristic of very low differential phase shift as the setting of potentiometer 42 is varied. The impedance of the combination of diode 34 and transistor 32 on the one hand and the combination of diode 35 and transistor 33 on the other hand are substantially constant as the potentiometer 42 is varied.

It should further be noted that the maximum gain condition (potentiometer 42 wiper near ground) can be determined by choosing the resistance of end resistor 44 with respect to the total resistance of potentiometer 42 so that the minimum potentiometer output voltage is approximately equal to the base bias voltage of transistors 32 and 33.

It should be observed that, due to the symmetry of the load circuits associated with transistors 24 and 25, the single control potentiometer 42 provides substantially equal effects on the outputs at terminals 40 and 41. The resulting gain controlled push-pull output signals are desirable for application to subsequent demodulator circuits (not shown).

In addition to the customer operated saturation control, direct control currents supplied by automatic control circuits also may be coupled to terminal 4 to vary the signal gain. For example, it may be desirable to bias a chroma signal amplifier to cutoff when low brightness image information is present in the accompanying luminance channel (not shown) of a color television receiver. In that case, sufficient direct current would be supplied to terminal 4 to bias diodes 34 and 35 fully on, cutting off transistors 32 and 33 and thereby reduce any tendency to produce chroma "noise" in low brightness scenes.

Other modifications and additions may also be made to the illustrated arrangement without departing from the scope of the present invention. For example, a PNP follower may be inserted between potentiometer 42 and the base of transistor 46 to provide improved temperature characteristics of the illustrated control arrangement.

What is claimed is:
1. A controllable gain signal amplifier comprising:
   a source of signals,
   a first signal amplification stage comprising at least a first transistor having a signal input electrode coupled to said source of signals and a main current conduction path including second and third electrodes,
   a source of quiescent operating current coupled to said second electrode,
   a first current splitter circuit comprising at least a first semiconductor rectifier device providing a first current path and a second transistor having a main current conduction path, said main conduction path of said second transistor and said first current path of said first rectifier device being coupled to said third electrode of said first transistor and being similarly poled for current conduction with respect to said third electrode,
   at least one output load circuit coupled to said main conduction path of said second transistor, and
   gain controlling means direct current coupled to said first rectifier device for proportioning the relative flow of current of said first transistor through said first current path and said main conduction path of said second transistor, said means comprising
   a source of direct voltage,
   a variable voltage divider coupled across said direct voltage source and having an output terminal at which a selected portion of said voltage is provided,
   coupling means comprising at least a third transistor having a base electrode direct current coupled to said output terminal and an emitter electrode, said coupling means further comprising a resistance direct current coupled between said last-named emitter electrode and said first rectifier device for supplying a controllable direct current to said device and thereby proportioning the flow of current through said first rectifier device and said second transistor, whereby the signal gain associated with said second transistor and said load circuit is varied.

2. A controllable gain signal amplifier according to claim 1 wherein:
   said source of direct voltage and said resistance are selected to provide a maximum direct current to said rectifier device proportional to said quiescent operating current.

3. A controllable gain signal amplifier according to claim 2 wherein:
   said maximum direct current is sufficient to substantially cut off conduction in said second transistor.

4. A controllable gain signal amplifier according to claim 1 wherein:
   said signal amplification stage further comprises a fourth transistor having a main current conduction path including second and third electrodes and coupled to said first transistor in a differential signal amplification arrangement,
   a second current splitter circuit comprising a second semiconductor rectifier device providing a second current path and a fifth transistor having a main current conduction path, said main conduction path of said fifth transistor and said second current path of said second rectifier device being coupled to said third electrode of said fourth transistor and being similarly poled for current conduction with respect to said third electrode of said fourth transistor,
   a second output load circuit coupled to said main conduction path of said fifth transistor, and
   means for direct current coupling said gain controlling means to said second rectifier device for proportioning the relative flow of current of said fourth transistor through said second current path and said main conduction path of said fifth transistor and thereby proportioning the flow of current through said second rectifier device and said fifth transistor, whereby the signal gain associated with said fifth transistor and said second output load circuit is varied.

5. A controllable gain signal amplifier according to claim 4 wherein:
   said source of direct voltage and said resistance are selected to provide a maximum direct current related to said quiescent operating current such that said second and fifth transistors are cut off.

6. A controllable gain signal amplifier according to claim 5 wherein:
   said main conduction path of each of said transistors corresponds to an emitter-collector path, whereby said first and second transistors form a first cascode signal amplifier and said fourth and fifth transistors form a second cascode signal amplifier.

7. A controllable gain signal amplifier according to claim 6 and further comprising:
   biasing means coupled in common to said second and fifth transistors selected for providing substantially zero conduction in said second and fifth transistors when said variable voltage divider is adjusted for minimum gain.

8. A controllable gain signal amplifier according to claim 7 wherein:
   said biasing means is selected to provide substantially one-half said quiescent operating current through said second and fifth transistors when said voltage divider is adjusted for maximum gain.

* * * * *

UNITED STATES PATENT OFFICE
CERTIFICATE OF CORRECTION

PATENT NO. : 3,970,948
DATED : July 20, 1976
INVENTOR(S) : L. A. Harwood and E. J. Wittmann It is certified that error appears in the above-identified patent and that said Letters Patent are hereby corrected as shown below:

In the Title, "[54] CONTROLLER GAIN SIGNAL AMPLIFIER" should read -- [54] CONTROLLABLE GAIN SIGNAL AMPLIFIER --.

Signed and Sealed this

Fifth Day of October 1976

[SEAL]

Attest:

RUTH C. MASON
Attesting Officer

C. MARSHALL DANN
Commissioner of Patents and Trademarks